United States Patent
Srinivasan et al.

(10) Patent No.: US 11,600,735 B2
(45) Date of Patent: Mar. 7, 2023

(54) METHOD FOR FABRICATING AN AVALANCHE PHOTODIODE DEVICE

(71) Applicant: IMEC VZW, Leuven (BE)

(72) Inventors: Ashwyn Srinivasan, Heverlee (BE); Peter Verheyen, Nijlen (BE); Philippe Absil, Loupoigne (BE); Joris Van Campenhout, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/370,578

(22) Filed: Jul. 8, 2021

(65) Prior Publication Data
US 2022/0013682 A1    Jan. 13, 2022

(30) Foreign Application Priority Data
Jul. 9, 2020 (EP) .................................... 20184864

(51) Int. Cl.
*H01L 31/107* (2006.01)
*H01L 31/18* (2006.01)

(52) U.S. Cl.
CPC ........ *H01L 31/1075* (2013.01); *H01L 31/184* (2013.01)

(58) Field of Classification Search
CPC ............... H01L 31/1075; H01L 31/184; H01L 31/02327; H01L 31/028; H01L 31/1804; H01L 31/18; H01L 31/107; H01L 21/266
See application file for complete search history.

(56) References Cited

U.S. PATENT DOCUMENTS 5,238,864 A * 8/1993 Maegawa ............. H01L 31/101
    257/233
5,385,849 A * 1/1995 Nakashiba .......... H01L 31/1804
    438/75

(Continued)

FOREIGN PATENT DOCUMENTS

CN     104347347 A  *  2/2015
JP     2015-046429 A    3/2015

OTHER PUBLICATIONS

Srinivasan, S.A., et al., "27 GHz Silicon-Contacted Waveguide-Coupled Ge/Si Avalanche Photodiode", Journal of Lightwave Technology, (2020), vol. 38(11), pp. 3044-3050.

(Continued)

*Primary Examiner* — Sitaramarao S Yechuri
(74) *Attorney, Agent, or Firm* — McDonnell Boehnen Hulbert & Berghoff LLP

(57) ABSTRACT

A method is provided for fabricating an avalanche photodiode (APD) device, in particular, a separate absorption charge multiplication (SACM) APD device. The method includes forming a first contact region and a second contact region in a semiconductor layer. Further, the method includes forming a first mask layer above at least a first contact region of the semiconductor layer adjacent to the first contact region, and forming a second mask layer above and laterally overlapping the first mask layer. Thereby, a mask window is defined by the first mask layer and the second mask layer, and the first mask layer and/or the second mask layer are formed above a second contact region of the semiconductor layer adjacent to the second contact region. Further, the method includes forming a charge region in the semiconductor layer through the mask window, wherein the charge region is formed between the first contact region and the second contact region, and comprises forming an absorp- (Continued)

tion region on the first contact region using the first mask layer. An APD fabricated by the disclosed method is also provided.

20 Claims, 21 Drawing Sheets

(56) References Cited

U.S. PATENT DOCUMENTS

| | | | | |
|---|---|---|---|---|
| 2007/0262475 | A1 | 11/2007 | Cheng et al. | |
| 2014/0170795 | A1* | 6/2014 | Prabhakar | H01L 31/1804 |
| | | | | 438/57 |
| 2015/0340538 | A1* | 11/2015 | Novack | H01L 31/028 |
| | | | | 250/214 A |
| 2019/0051526 | A1* | 2/2019 | Khang | H01L 21/823828 |
| 2019/0378949 | A1 | 12/2019 | Simoyama | |

OTHER PUBLICATIONS

Extended European Search Report from the European Patent Office, dated Dec. 7, 2020, for European Patent Application No. 20184864.5, pp. 1-10.

* cited by examiner

METHOD FOR FABRICATING AN AVALANCHE PHOTODIODE DEVICE

CROSS-REFERENCE

This application claims priority from European Patent application No. 20184864.5, filed on Jul. 9, 2020, which is incorporated by reference in its entirety.

TECHNICAL FIELD

The present disclosure relates to photodetectors and specifically to avalanche photodetectors targeting optical communication, light sensing or quantum communication applications. The present disclosure further relates to a method for processing an avalanche photodiode (APD) device, in particular, a separate absorption charge multiplication (SACM) APD device.

BACKGROUND OF THE DISCLOSURE

In the above-given technical field of APD devices (e.g., photodetectors) for optical communication, light sensing or quantum communication, a receiver sensitivity and operating data rates are crucial requirements for performance, as they determine the power consumption of the optical communication link. APD devices have great potential to enable these requirements.

Conventional APD devices are typically realized in two device architectures. The first device architecture is a standard pin form, which is also referred to as pin-APD device. The second device architecture is a p+/i/p−/i/n+ form, which is also referred to as SACM APD device. In the standard pin APD devices, a light absorption and a multiplication of carriers due to the avalanche effect occur in an intrinsic region of the diode. However, in SACM APD devices, an absorption region and a multiplication region of the diode are separated by a charge region (e.g., the p− doped region of a p+/p−/n+ diode). While standard pin APD devices have the potential for low operating voltages, the SACM APD devices have a higher sensitivity and can operate at higher speeds. Thus, the SACM APD devices can be more attractive for optical interconnections, optical communication, local optical quantum computing, quantum communication, terahertz communication, terahertz imaging, sensing, etc.

SACM APD devices can work efficiently if the absorption region and the multiplication region are separated by the charge region (also referred to as field control region or layer). In a SACM APD device, light is absorbed in the absorption region, and an electric field due to a reverse bias separates photo-generated carriers, with electrons moving to the multiplication region. The high reverse bias also allows for an avalanche of the carriers in the multiplication region. The charge region controls/balances the electrical fields in the absorption region and the multiplication region, respectively, and thus protects the typically low-bandgap semiconductor material (e.g., Ge) in the absorption region from high electrical fields needed in the multiplication region.

Thereby, the doping level and the width of the charge region can play a crucial role in balancing the electric field between the absorption region and the multiplication region. Thus, controlling the doping level and thickness of the charge region can be critical for the overall behavior of the SACM APD device.

Conventionally, SACM APD devices are realized in a vertical formation, which either requires dedicated epitaxially grown stacks or contacts on the absorption region. Such vertical SACM APD devices with dedicated epitaxially grown stacks have the benefit of controlling the doping layer and the thickness of the charge region with very good precision. However, integration of the epitaxially grown stacks into an existing silicon photonics platform can be challenging, due to the epitaxy complexity. Further, the vertical device designs also require contacting schemes on the absorption region, which can be a yield issue. Moreover, the epitaxially grown stacks can restrict the freedom in designing the devices, as every design generally requires a dedicated epitaxy study and epitaxy split.

Therefore, there is need for different SACM APD device designs.

SUMMARY OF THE DISCLOSURE

An example of such a different device design may be a lateral SACM APD device. For such a lateral device formation, a designer could easily design the diode using dedicated masks. However, the challenge with this design can lie in fabricating the charge region, and particularly controlling the width, doping level and the position of the charge region with respect to the absorption region with good accuracy.

In view of the above-mentioned challenges and disadvantages, embodiments of the present disclosure aim to provide an improved SACM APD device and a method for its fabrication. An objective is, in particular, to provide a method for fabricating a lateral SACM APD device, which does not suffer from the above-mentioned disadvantages of the vertical SACM devices, and which has a charge region that can be accurately fabricated and controlled. In particular, a doping level and a width of the charge region should be controllable with high accuracy. The width of the charge region should particularly be controllable down to 50 nm.

The objective can be achieved by the embodiments of the disclosure provided in the enclosed independent claims. Beneficial implementations of these embodiments are defined in the dependent claims.

In particular, embodiments of the present disclosure can enable fabricating the charge region with a very small width in the order of 100 nm or less, or even of 50 nm. In addition, embodiments of the disclosure can enable a lateral SACM APD device that does not require contacts on the absorption region.

A first aspect of the present disclosure provides a method for fabricating an avalanche photodiode device, the method comprising: forming a first contact region and a second contact region in a semiconductor layer; forming a first mask layer above at least a first region of the semiconductor layer adjacent to the first contact region; forming a second mask layer above and laterally overlapping the first mask layer, wherein a mask window is defined by the first mask layer and the second mask layer, and wherein the first mask layer and/or the second mask layer are formed above a second region of the semiconductor layer adjacent to the second contact region; forming a charge region in the semiconductor layer through the mask window, wherein the charge region is formed between the first region and the second region; and forming an absorption region on the first region using the first mask layer.

The width of the charge region can be accurately controlled by controlling the size of the mask window. The size of the mask window can be accurately controlled by forming the two mask layers. The doping level of the charge region can further be accurately controlled by forming the charge region, e.g. by implantation, through the mask window. Accordingly, an improved lateral SACM APD device is enabled.

Notably, in this disclosure, the terms "above" or "on" with respect to layers or regions of the APD device may mean that these are arranged vertically, i.e., along the formation/growth direction of the APD device. Terms "adjacent" or "between" in the same layer may mean that these are arranged laterally, i.e., perpendicular to the growth direction of the APD device. The lateral overlap of the first mask layer and the second mask layer may thus be seen in a view along the formation/growth direction of the APD device, e.g., in a top view of the APD device. Lateral may be in the plane or parallel to the plane of a layer, e.g., the semiconductor layer. In the figures, the vertical direction is from bottom to top of the figure, and the lateral direction is from left to right and/or into the plane of the figure.

In an implementation form of the method, the charge region is adjacent to the first region; and/or the charge region is laterally adjacent to the absorption region.

Thus, the charge region can be laterally arranged between the second region, which may be the modulation region of the APD device, and the absorption region. Thus, the charge region can optimally balance the electric field between the absorption region and the multiplication region.

In an implementation form of the method, the charge region can have a width of below 100 nm, in particular, has a width in a range of 50-60 nm.

In particular, the width of the charge region can thus be precisely controlled down to 50 nm. Of course, the method may also be used for charge regions having a width larger than 100 nm.

In an implementation form of the method, the second region is configured to function as an amplification region in the avalanche photodiode device.

In an implementation form of the method, the charge region is formed by implanting dopants through the mask window into the semiconductor layer.

Thereby, the doping level in the charge region can be precisely controlled by the implementation of the dopants.

In an implementation form of the method, the first mask layer may be formed above the first region and above the second region of the semiconductor layer, and the method further comprises: etching into the first mask layer to obtain an opening in the first mask layer; and forming the second mask layer above the first mask layer such that the mask window is defined by the opening in the first mask layer.

In an implementation form of the method, a width of the mask window may be controlled by controlling the width of the opening when etching into the first mask layer.

That is, in this implementation form, the width of the charge region can be controlled by the accurate mask layer (e.g., polycrystalline silicon) etch, which can be controlled with good confidence.

In an implementation form of the method, the first mask layer may be formed only above the first region, and the method further comprises: forming the second mask layer above the second region such that the mask window is defined by a gap region where the first mask layer and the second mask layer do not laterally overlap.

In an implementation form of the method, a width of the mask window may controlled by controlling the lateral arrangement of the second mask layer relative to the first mask layer when forming the second mask layer.

That is, in this implementation form, the width of the charge region can be controlled without any CD constraints, only limited by the overlap error between the first mask layer and second mask layer, which can be very precisely controlled.

In an implementation form of the method, the first mask layer is formed by depositing polycrystalline silicon (poly-Si) onto the semiconductor layer and then patterning the polycrystalline silicon.

The poly-Si patterning can be controlled very precisely, and with commonly used processing tools.

In an implementation form of the method, the second mask layer may be formed by applying a resist and then patterning the resist.

In an implementation form of the method, the absorption region may be formed by: removing the second mask layer; forming a sacrificial layer around the first mask layer; removing the first mask layer above the first region, thereby forming a sacrificial layer window; and depositing absorption material through the sacrificial layer window onto the first region, thereby forming the absorption region.

The absorption region can thus be created with high accuracy.

In an implementation form of the method, the absorption region may be formed by absorption material that comprises germanium; and/or the absorption region may be formed by epitaxial growth of the absorption material.

Thus, a high quality absorption region can be fabricated, which improves the device performance.

In an implementation form of the method, the absorption region may be formed in an indentation of the semiconductor layer, in particular, in an indentation spanning the first region.

Thus, the absorption region may be partly arranged to be laterally adjacent to the charge region, which allows the charge region to even better balance the electric field between the absorption region and the multiplication region.

In an implementation form, the method further comprises: forming a first contact on the first contact region and a second contact on the second contact region; and/or not forming any contact on the absorption region.

Thus, no contacting schemes on the absorption region are required, which may improve the yield of fabricating the APD device.

A second aspect of the present disclosure provides an avalanche photodiode device fabricated by using the method according to the first aspect or any implementation thereof.

The APD device of the second aspect can be easy to implement without any modification of process flows dedicated for these devices. There is also no need for dedicated epitaxy developments. Further, there is no need for contacts on the absorption region, or for any other active layers.

BRIEF DESCRIPTION OF THE DRAWINGS

The above described aspects and implementations are explained in the following description of embodiments with respect to the enclosed drawings.

DETAILED DESCRIPTION OF EMBODIMENTS OF THE DISCLOSURE

Figure 1:
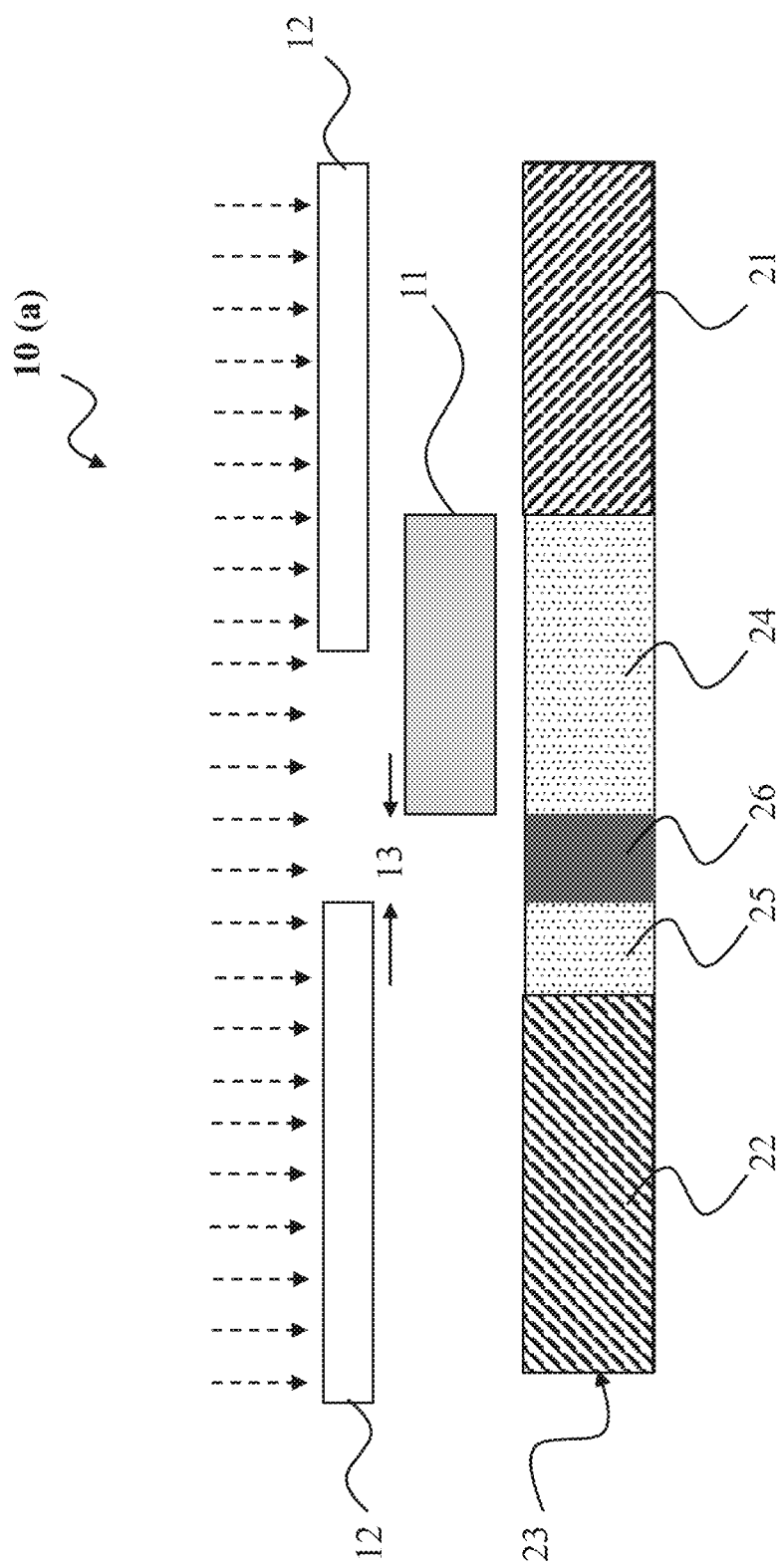
FIG. 1 show a first alternative of a method according to an embodiment of the disclosure.
Figure 2:
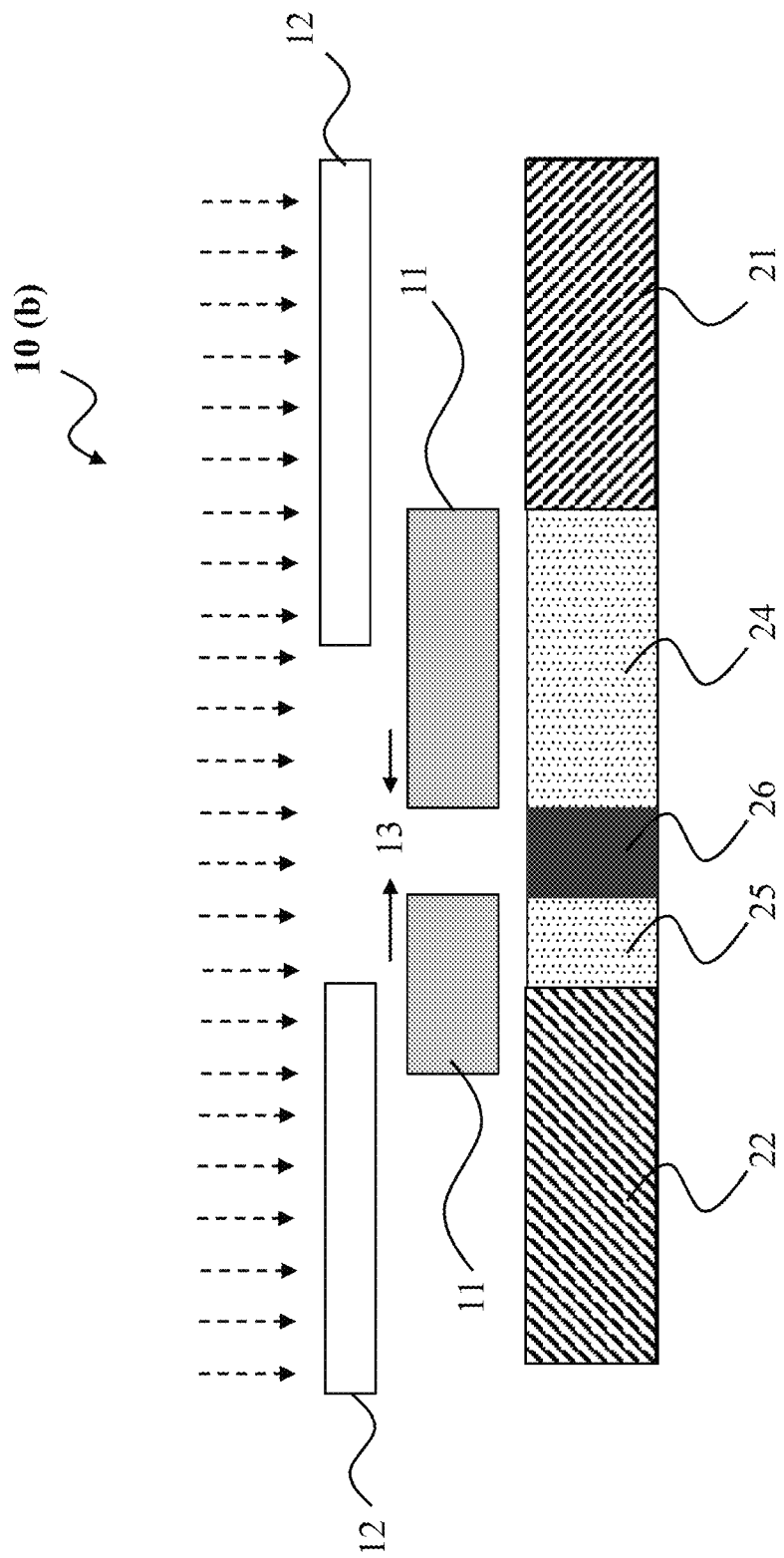
FIG. 2 show a second alternative of a method according to an embodiment of the disclosure.

FIG. 1 shows a first alternative (a) of a general method 10 according to an embodiment of the disclosure, and FIG. 2 shows a second alternative (a) of the general method according to an embodiment of the disclosure. Both alternatives have several steps in common, and both alternatives are methods 10 for fabricating an APD device 20 according to an embodiment of the disclosure, as it is for example shown in FIG. 3 or FIG. 4.

In both alternatives (a) and (b), a first contact region 21 and a second contact region 22 are formed in a semiconductor layer 23. The contact regions 21 and 22 may be doped regions, for instance, one region may be p-doped and one region may be n-doped. The semiconductor layer 23 may be the top layer of a silicon on insulator (SOI) substrate 50 (see, e.g., FIG. 5).

Further, a first mask layer 11 may be formed in both alternatives (a) and (b) above at least a first region 24 of the semiconductor layer 23, wherein the first region 24 is adjacent to the first contact region 21.

Further, a second mask layer 12 may be formed above and laterally overlapping the first mask layer 11, wherein a mask window 13 may be defined by the first mask layer 11 and the second mask layer 12. The first mask layer 11 and/or the second mask layer 12 may be formed above a second region 25 of the semiconductor layer 23, wherein the second region 25 may be adjacent to the second contact region 22. The second region 25 may be configured to function as an amplification region in the APD device 20.

In the first alternative (a) of FIG. 1, the first mask layer 11 may be formed only above the first region 24, i.e., only the second mask layer 12 may be formed above the second region 25. In the second alternative (b) of FIG. 2, the first mask layer 11 may be formed above the first region 24 and above the second region 25 of the semiconductor layer 23, i.e., both mask layers 11 and 12 may be formed above the second region 25.

Further, in both alternatives (a) and (b), a charge region 26 may be formed in the semiconductor layer 23 through the mask window 13, wherein the charge region 26 may be formed between the first region 24 and the second region 25. The charge region 26 may be formed by implanting dopants through the mask window 13 and into the semiconductor layer 23.

In the second alternative (b) of FIG. 2, the method 10 may comprise etching into the first mask layer 11 to obtain an opening in the first mask layer. Further, the second mask layer 12 may be formed such above the first mask layer 11, that the mask window 13 may be defined by the opening in the first mask layer 11. Thus, a width of the mask window 13 may be controlled by controlling the width of the opening when etching into the first mask layer 11.

In the first alternative (a) of FIG. 1, the second mask layer 12 may be formed such above the second region 25, that the mask window 13 may be defined by a gap region where the first mask layer 11 and the second mask layer 12 do not laterally overlap. Thus, a width of the mask window 13 may be controlled by controlling the lateral arrangement of the second mask layer 12 relative to the first mask layer 11 when forming the second mask layer 12, i.e., by controlling the overlap and non-overlap of the first and second mask layers 11, 12.

In both alternatives (a) and (b) an absorption region 27 may be formed on the first region 24 using the first mask layer 11. This leads to the APD device 20 shown in FIG. 3. The APD device 20 shown in FIG. 2 may be a lateral SACM APD device, wherein the absorption region 27, the charge region 26, and the multiplication region (second region 25) are formed laterally between the first contact region 21 and the second contact region 22. The width we of the charge region 26 can be precisely controlled by the method 10, in particular, down to 50 nm or even less. Also, a width $w_M$ of the multiplication region (i.e., of the second region 25) may be precisely controlled.

Figure 3:
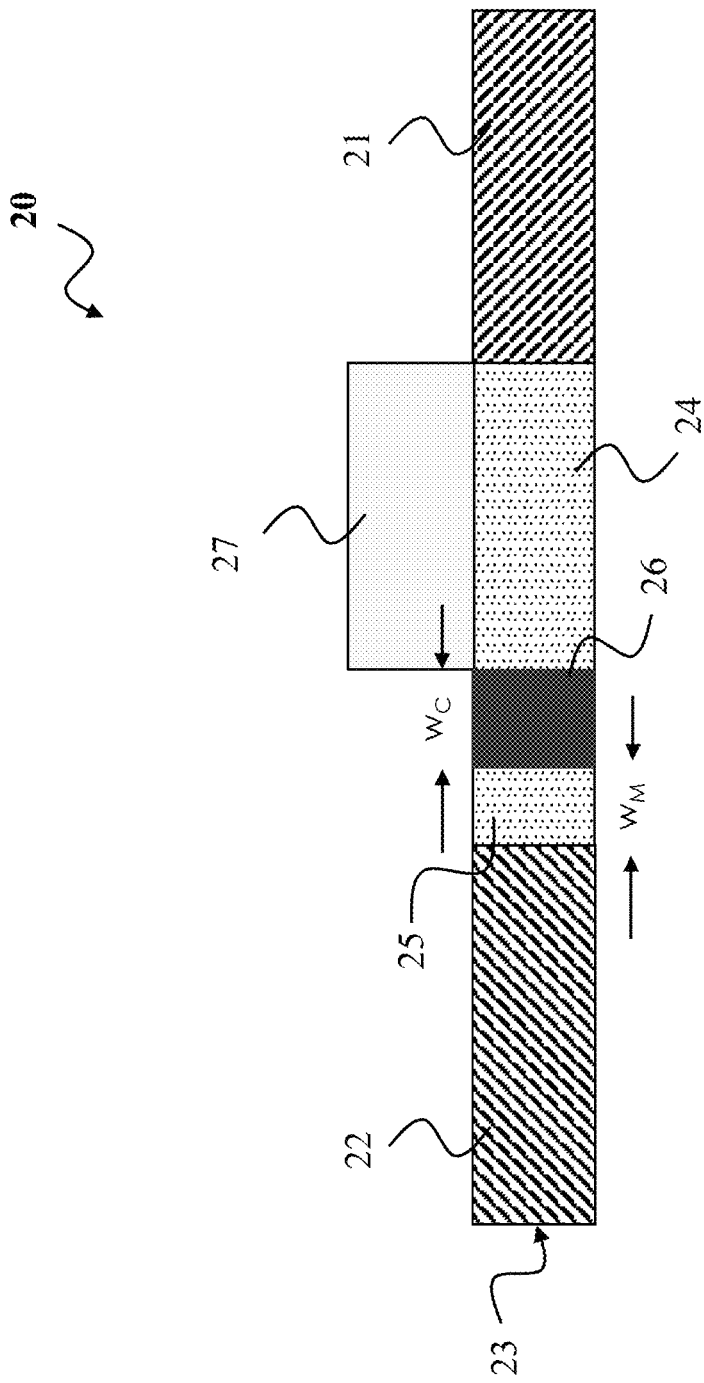
FIG. 3 shows an APD device fabricated according to the method of FIG. 1 or FIG. 2, according to an embodiment of the disclosure.
Figure 4:
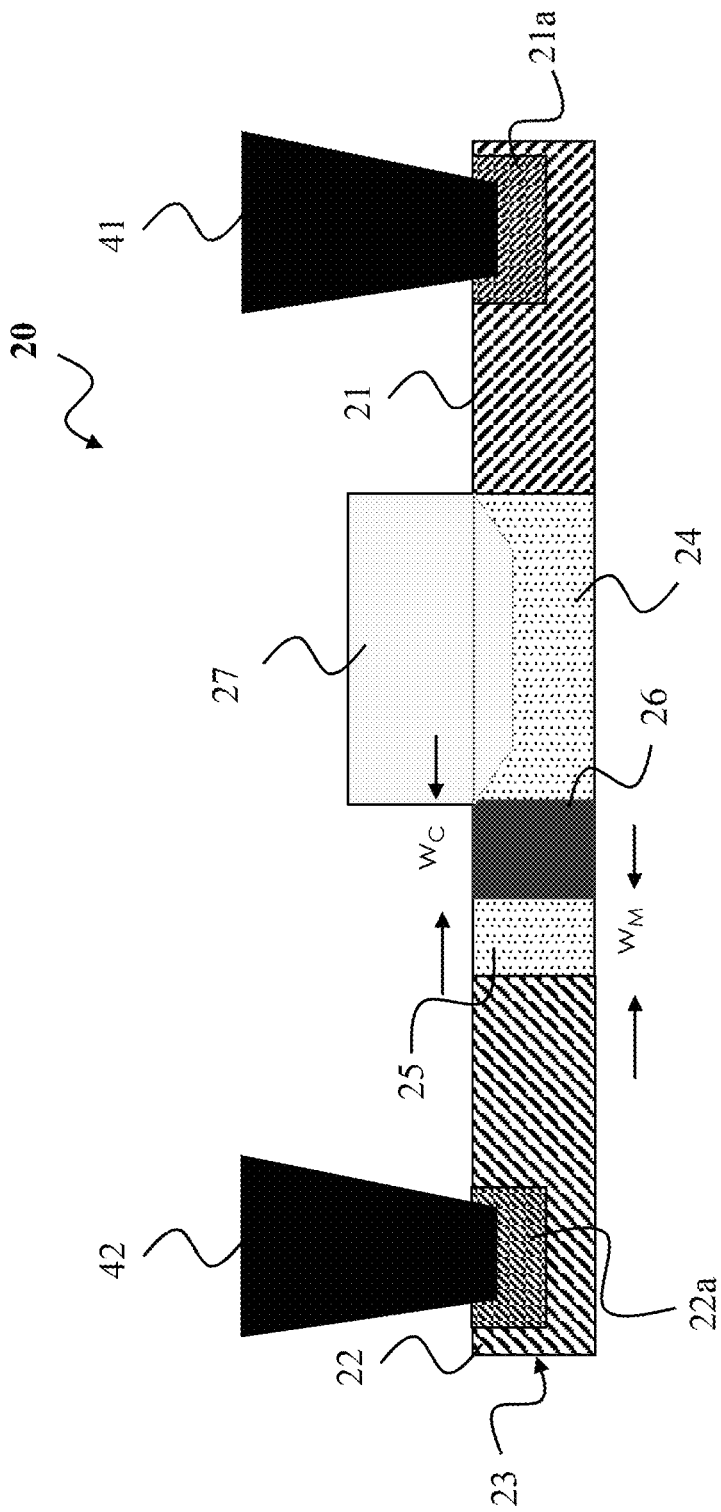
FIG. 4 shows an APD device according to an embodiment of the disclosure.

FIG. 4 shows another APD device 20, according to an embodiment of the disclosure, which builds on the embodiment shown in FIG. 3. Same elements in FIG. 3 and in FIG. 4 are labelled with the same reference signs, and may be implemented likewise.

The APD device 20 of FIG. 4 includes further a first contact 41 that may be formed on the first contact region 21, and a second contact 42 that may be formed on the second contact region 22. In particular, the first contact 41 may be formed on a highly-doped region 21a of the first contact region 21, and the second contact 42 may be formed on a highly-doped region 22a of the second contact region 22. Generally, the first contact region 21 is p-doped and the highly-doped region 21a is accordingly highly p-doped, and the second contact region 22 is n-doped and the highly-doped region 22a is highly n-doped. In this case also the charge region 26 is p-doped. For instance, the charge region 26 may be p-doped to a lower extend as the first contact region 21. However, the connectivity types in the APD device 20 can be reversed.

Notably, in the APD device 20 shown in FIG. 4, no contact may be formed on the absorption region 27, i.e., an upper surface (top surface) of the absorption region 27 may be free/exposed.

Figure 5:
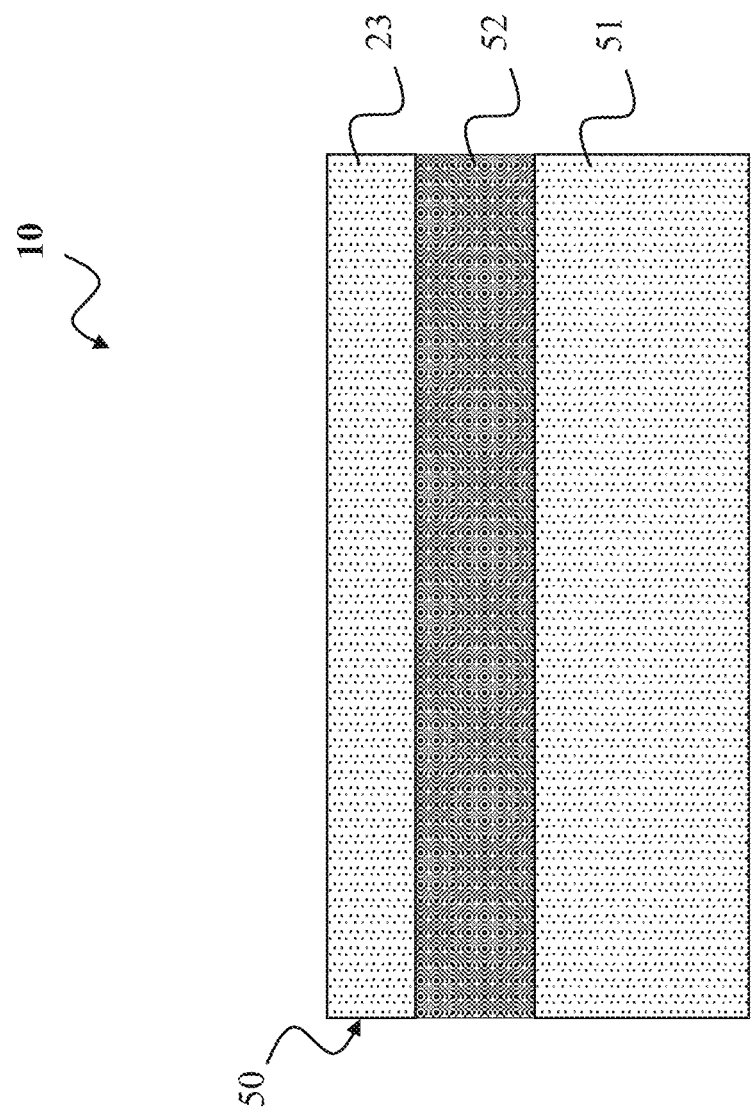
FIG. 5 shows a step of a first alternative of a method according to an embodiment of the disclosure.
Figure 6:
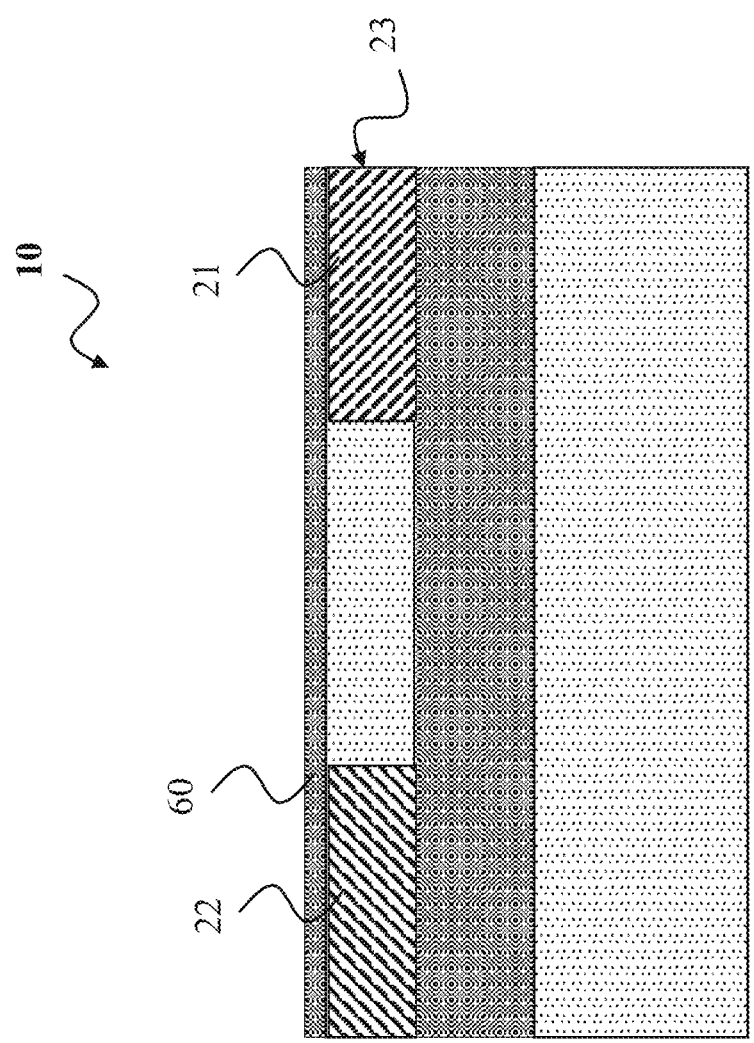
FIG. 6 shows a further step of the first alternative of a method according to an embodiment of the disclosure.
Figure 7:
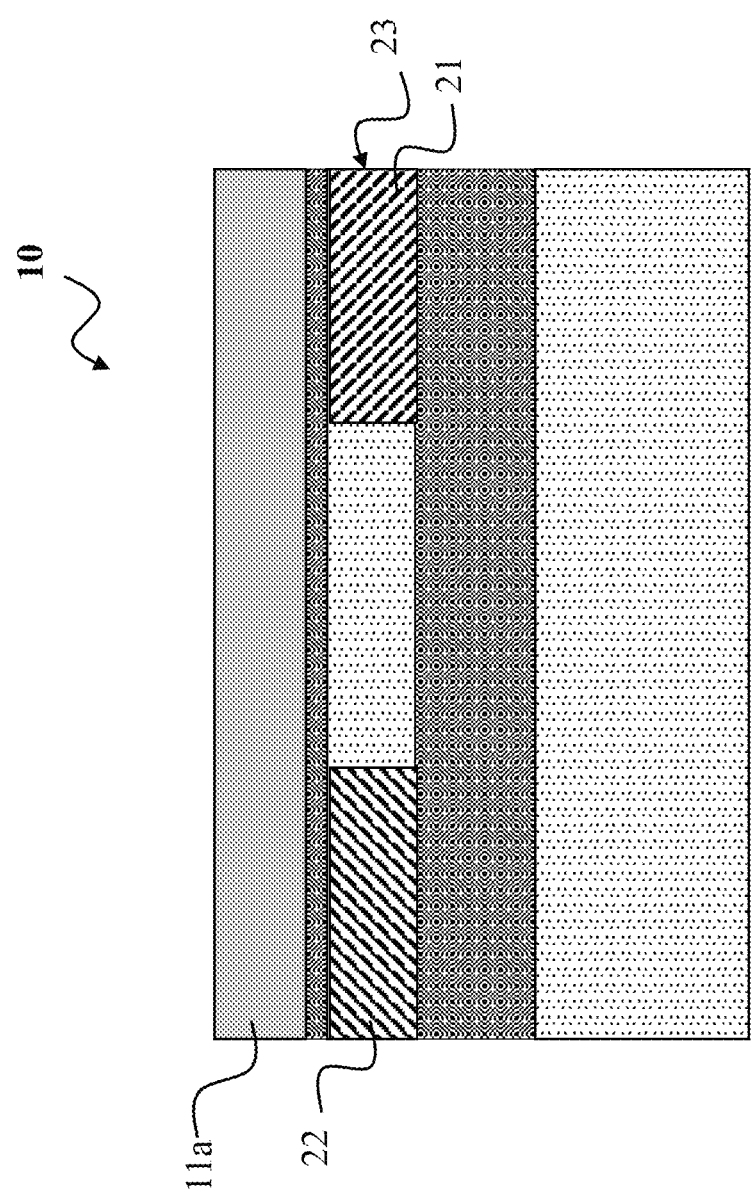
FIG. 7 shows a further step of the first alternative of a method according to an embodiment of the disclosure.

FIGS. 5-14 show steps of the first alternative (a) of a specific method 10 according to an embodiment of the disclosure, which builds on the more general embodiment shown in FIG. 1. FIGS. 5-7 and FIGS. 15-20 show steps of the second alternative (b) of a specific method 10 according to an embodiment of the disclosure, which builds on the more general embodiment shown in FIG. 2. That is, FIGS. 5-7 are valid for both alternatives (a) and (b). Same elements in all the figures are labelled with the same reference signs, and may be implemented likewise.

FIG. 5 shows that in a first step of the method 10, a SOI substrate 50 may be provided, which includes a silicon substrate layer 51, an insulator layer 52 (silicon oxide layer) on the substrate layer 51, and a silicon layer as the semiconductor layer 23. The SOI substrate 50 may be provided in the form of a wafer.

FIG. 6 shows that in a next step of the method 10, the first contact region 21 and the second contact region 22 may be formed in the semiconductor layer 23. For instance, the first contact region 21 and the second contact region 22 may be formed by implantation of respective dopants into the silicon, in order to form an n-doped and p-doped contact region, respectively. Before forming the first contact region 21 and the second contact region 22, a thin oxide layer 60 may be provided on the semiconductor layer 23. For instance, the thin oxide layer 60 may have a thickness of 5-10 nm.

FIG. 7 shows that in a next step of the method 10, a material 11a for the first mask layer 11 may be provided onto the thin oxide layer 60. In particular, a polycrystalline silicon layer may be deposited as the first mask layer material 11a.

Figure 8:
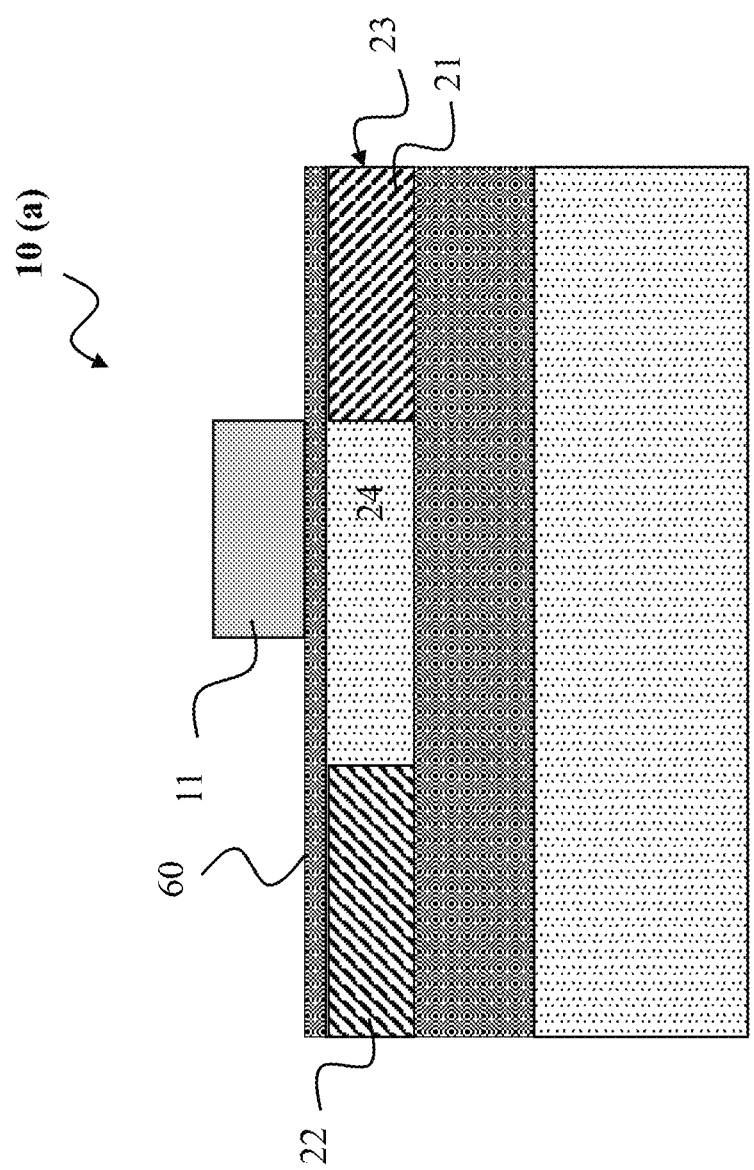
FIG. 8 shows a further step of the first alternative of a method according to an embodiment of the disclosure.

FIG. 8 shows that in a next step of the first alternative (a) of the method 10, the first mask layer material 11a may be patterned into the first mask layer 11. In this first alternative (a) of the method 10, the first mask layer 11 may be only formed above the first region 24 of the semiconductor layer 23. The first mask layer 11 may be patterned by lithography and etching. Thereby, the oxide layer 60 may function as an etch stop.

Figure 9:
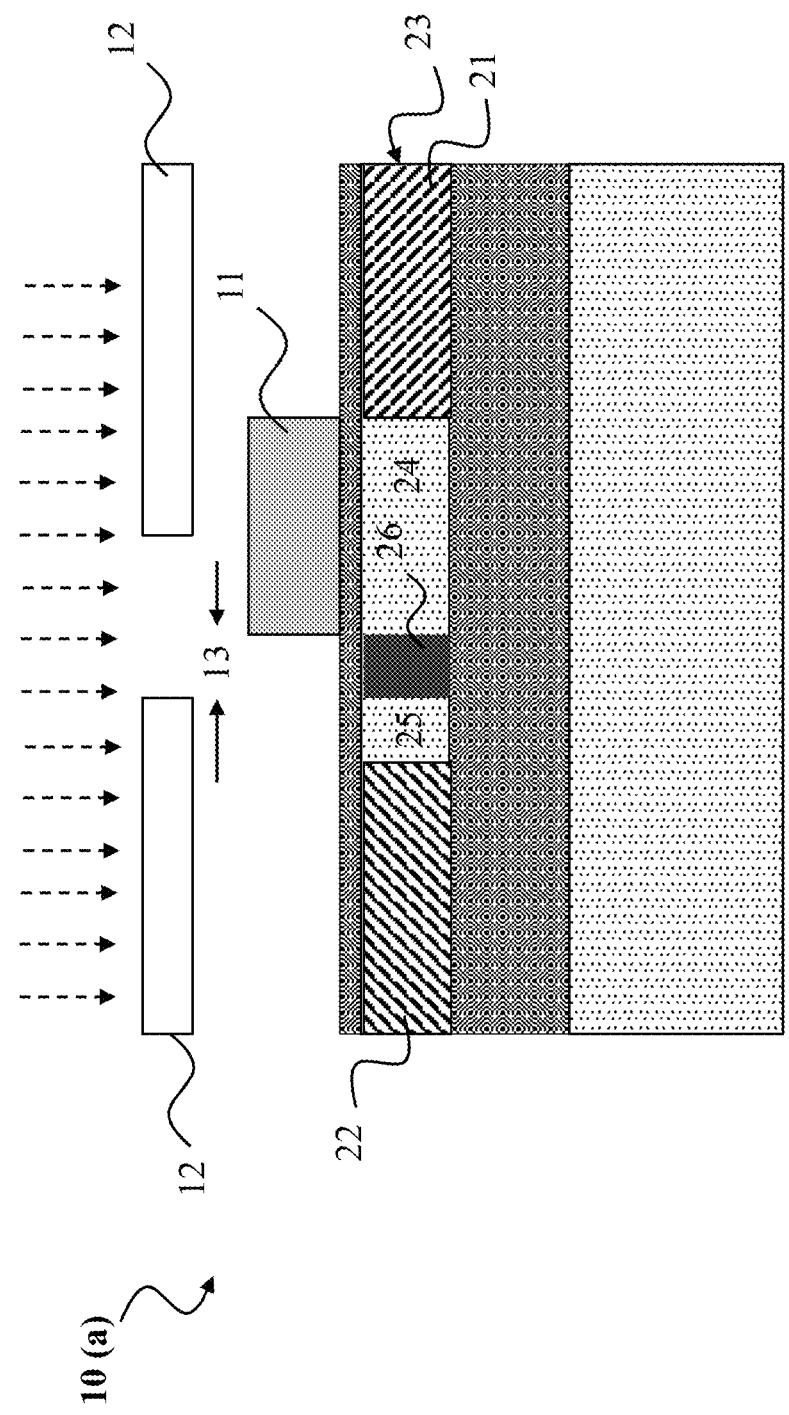
FIG. 9 shows a further step of the first alternative of a method according to an embodiment of the disclosure.

FIG. 9 shows that in a next step of the first alternative (a) of the method 10, the second mask layer 12 may be formed above the first mask layer 11, wherein the second mask layer 12 laterally overlaps with the first mask layer 11. That may mean that the second mask layer 12 can be arranged above at least a part of the first mask layer 11. The second mask layer 12 can, in particular, be formed such above the second region 25 that the mask window 13 may be defined by a gap region where the first mask layer 11 and the second mask layer 12 do not laterally overlap, i.e., the first mask layer 11 and the second mask layer 12 can have an opening in a top view. The width of the mask window 13 can be controlled by controlling the lateral arrangement of the second mask layer 12 relative to the first mask layer 11 when forming the second mask layer 12, i.e., by controlling the lateral overlap of the first mask layer 11 and the second mask layer 12. Further, the charge region 26 can be formed in FIG. 9 by implanting dopants through the mask window 13, and into the semiconductor layer 23 (as indicated by the arrows).

Figure 10:
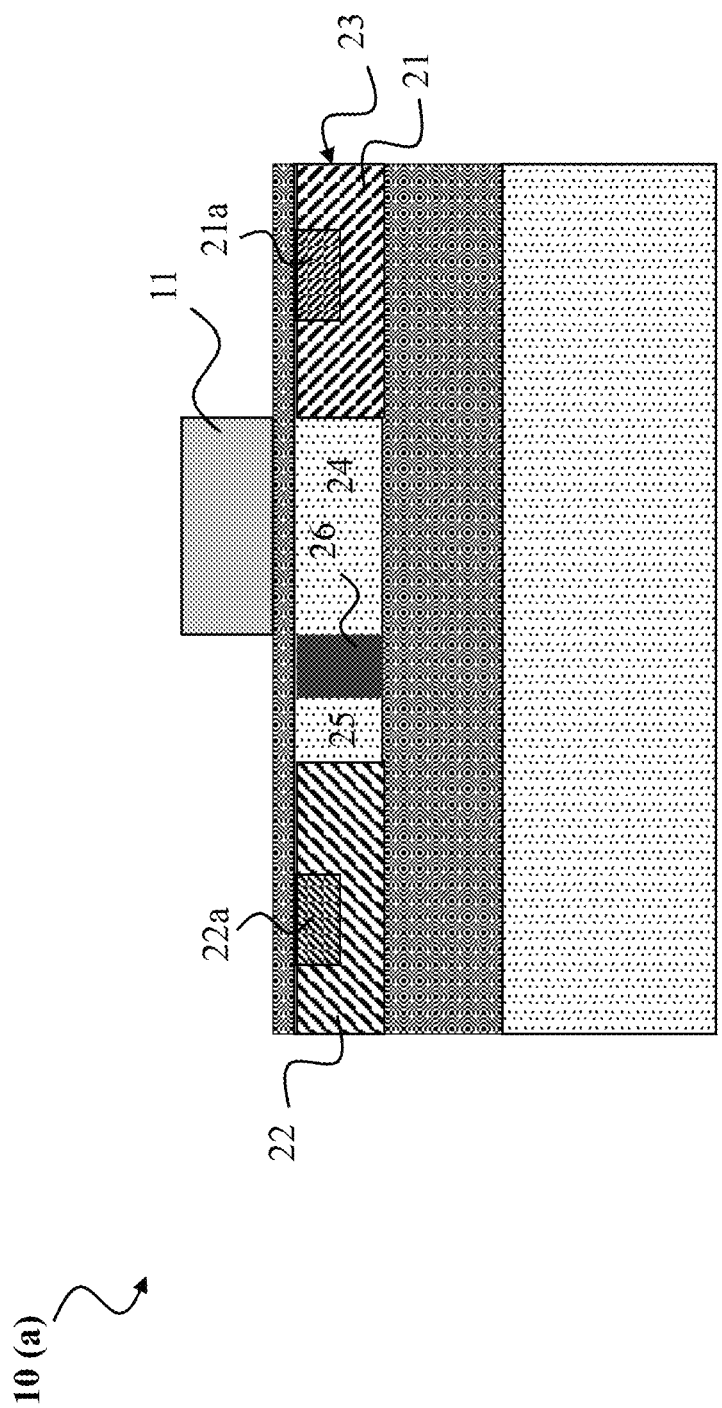
FIG. 10 shows a further step of the first alternative of a method according to an embodiment of the disclosure.

FIG. 10 shows that in a next step of the first alternative (a) of the method 10, the second mask layer 12 may be removed, and the highly-doped regions 21a and 22a may be formed in the first contact region 21 and the second contact region 22, respectively. These highly-doped regions 21a and 22a may be formed by implantation of dopants of different type to form p-doped and n-doped regions, respectively.

Figure 11:
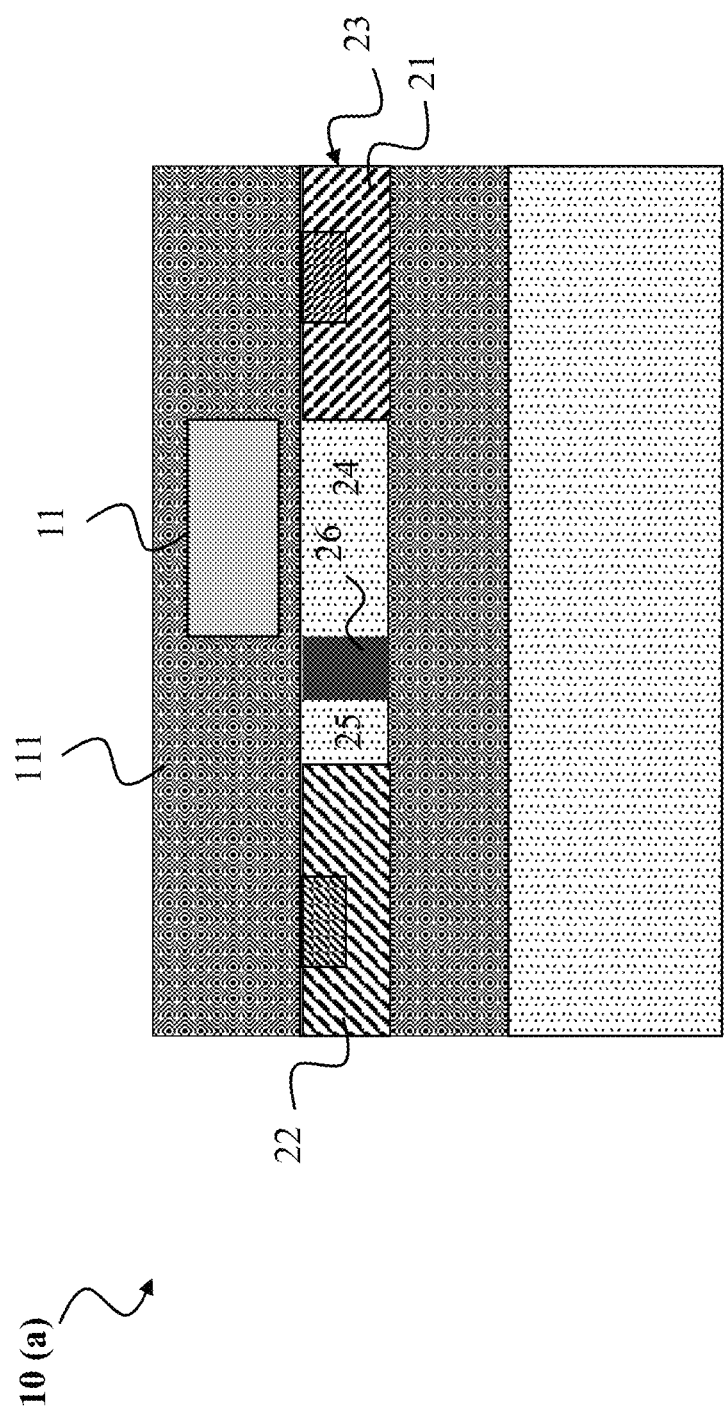
FIG. 11 shows a further step of the first alternative of a method according to an embodiment of the disclosure.

FIG. 11 shows that in a next step of the first alternative (a) of the method 10, a sacrificial layer 111 may be formed around the first mask layer 11. The sacrificial layer 111 may comprise an oxide, for instance, silicon oxide. After forming the sacrificial layer 111, the top surface of the intermediate structure may be planarized, in order to form a planar upper surface.

Figure 12:
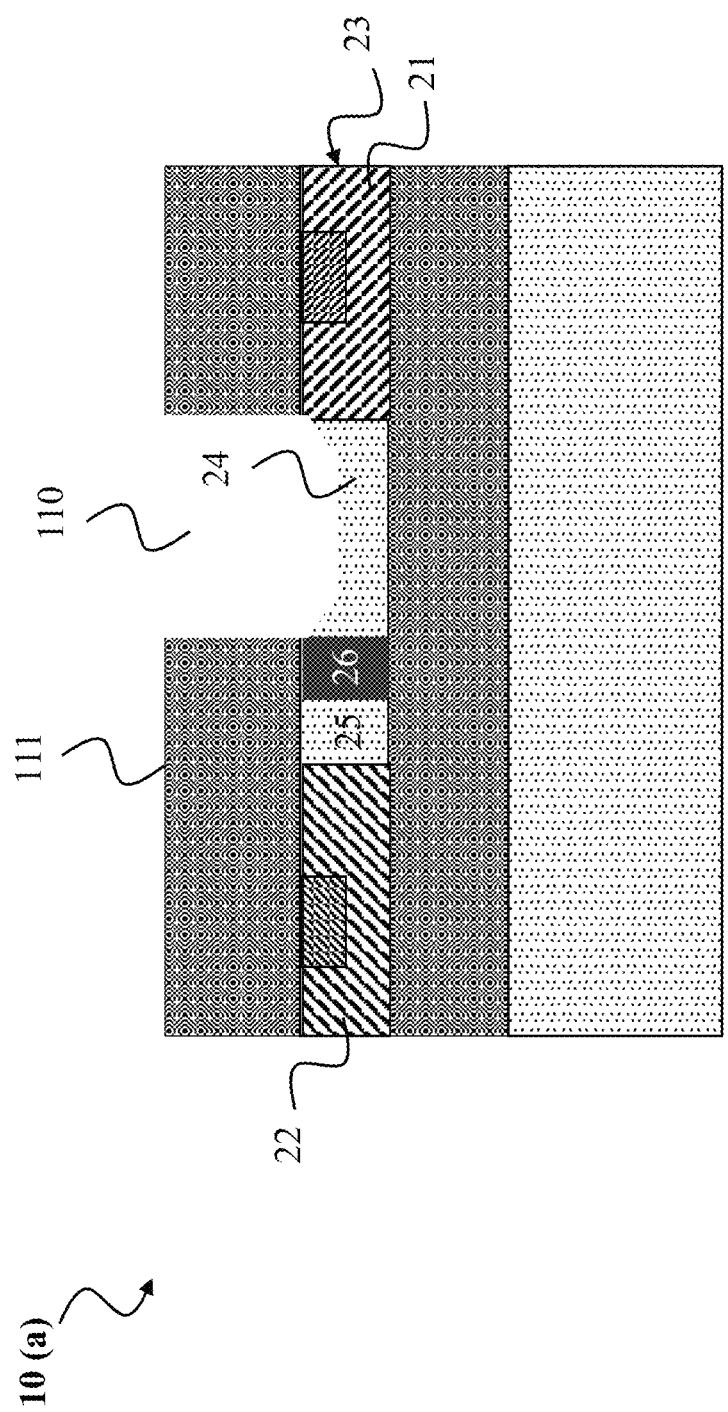
FIG. 12 shows a further step of the first alternative of a method according to an embodiment of the disclosure.

FIG. 12 shows that in a next step of the first alternative (a) of the method 10, the first mask layer 11 may be removed above the first region 24, wherein a sacrificial layer window 110 may be formed. That is, the window 110 may be formed by etching into the sacrificial layer 111, wherein the first mask layer 11 may be removed. The first mask layer 11 may be used to align the etching. Notably, the etching of the sacrificial layer window 110 may also etch into the first region 24 of the semiconductor layer 23, thereby forming an indentation in the first region 24.

Figure 13:
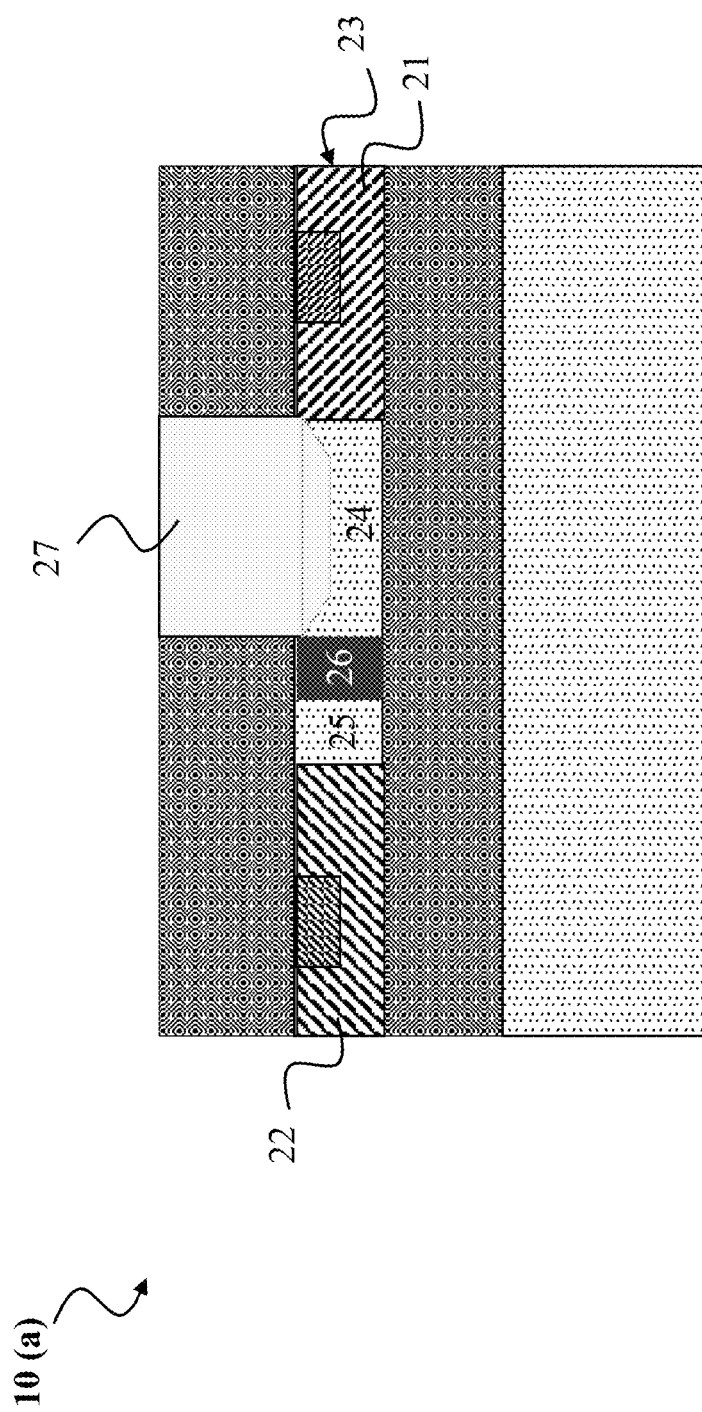
FIG. 13 shows a further step of the first alternative of a method according to an embodiment of the disclosure.

FIG. 13 shows that in a next step of the first alternative (a) of the method 10, absorption material may be deposited into the sacrificial layer window 110, onto the first region 24, thereby forming the absorption region 27. Since the window 110 was etched using the first mask layer 11, the forming of the absorption region 27 is also based on using the first mask layer 11. Further, the absorption region 27 may be formed in the indentation of the semiconductor layer 23, in particular, in an indentation spanning the first region 24. The step may also comprise CMP to planarize the surface of the absorption region 27 and the sacrificial layer 111, respectively. In particular, the absorption region 27 may comprise germanium as absorption material, or a germanium-based material. The absorption material may further be epitaxially grown into the window 110 to form the absorption region 27.

Figure 14:
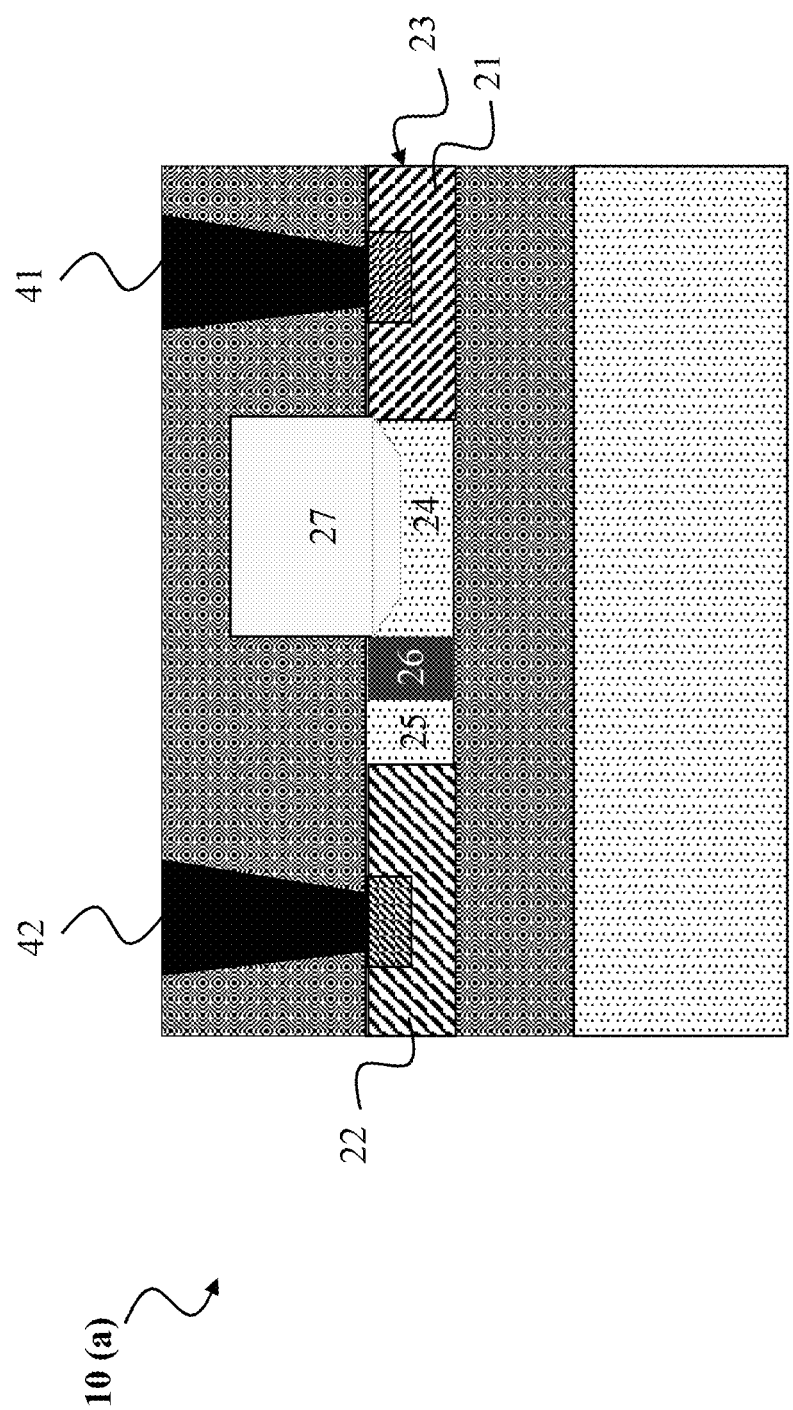
FIG. 14 shows a further step of the first alternative of a method according to an embodiment of the disclosure.

FIG. 14 shows that in a final step of the first alternative (a) of the method 10, a back end of line (BEOL) processing may be performed, wherein the first contact 41 is formed on the first contact region 21 and the second contact 42 may be formed on the second contact region 22a. This concludes the processing of the APD device 20 according to the first alternative (a) of the method 10.

Figure 15:
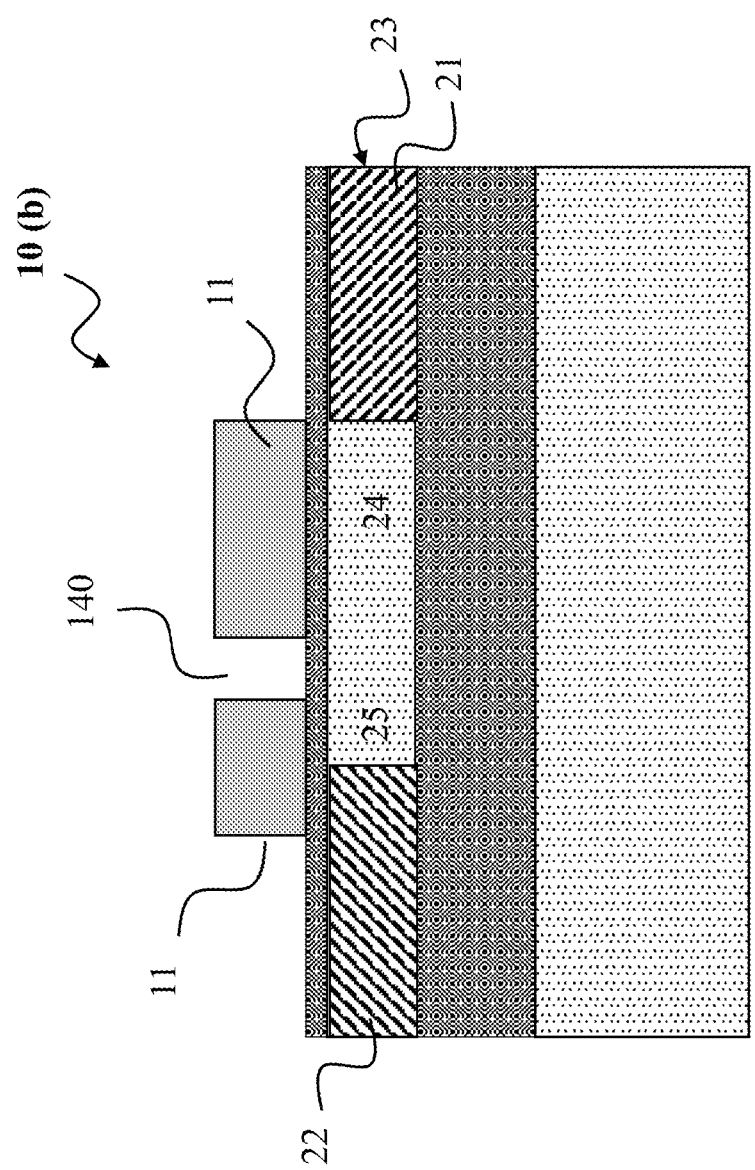
FIG. 15 shows a step of a second alternative of a method according to an embodiment of the disclosure.

FIG. 15 shows a step of the second alternative (b) of the method 10, which follows the step shown in FIG. 7. In FIG. 15, the first mask layer material 11a can be patterned into the first mask layer 11. In this first alternative (b) of the method 10, the first mask layer 11 can be formed both above the first region 24 and above the second region 25 of the semiconductor layer 23. However, etching into the first mask layer 11 may be performed to obtain an opening 140 in the first mask layer 11, namely located above the region of the semiconductor layer 23 where the charge region 26 can be formed (between the first region 24 and the second region 25).

Figure 16:
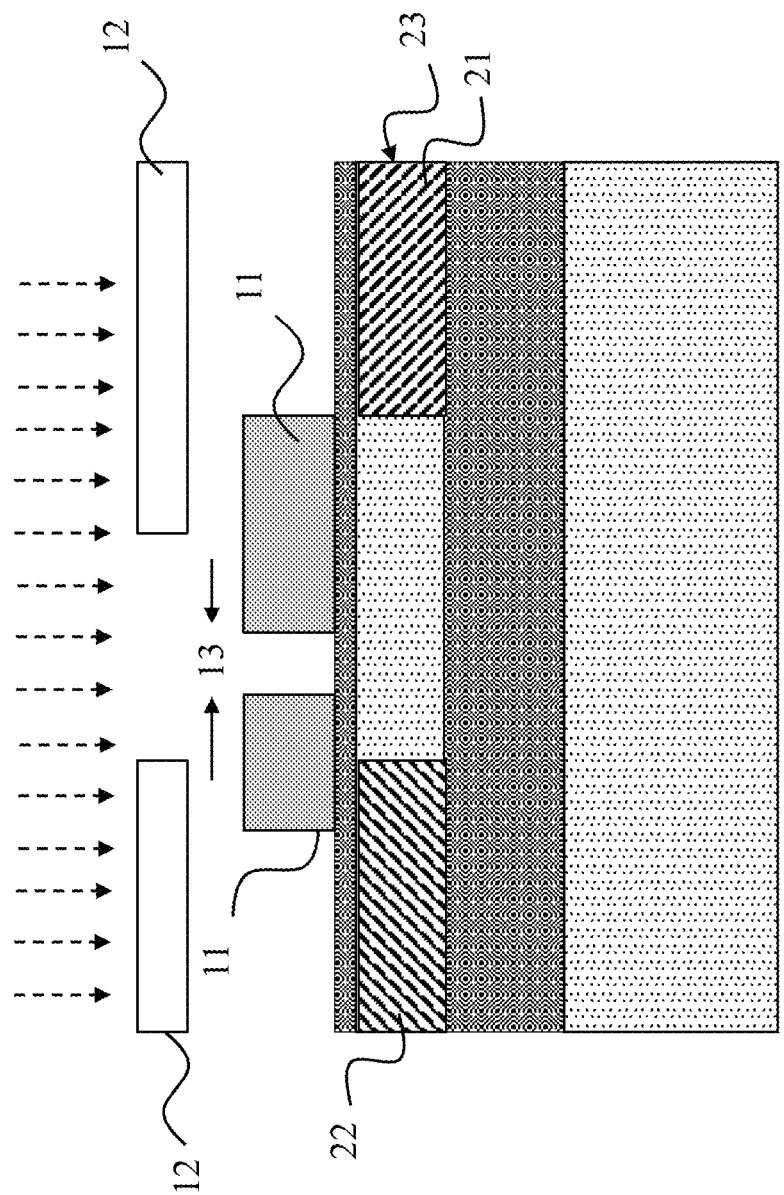
FIG. 16 shows a further step of the second alternative of a method according to an embodiment of the disclosure.

FIG. 16 shows that in a next step of the second alternative (b) of the method 10, the second mask layer 12 may be formed above the first mask layer 11, and laterally overlapping with the first mask layer 11. The second mask layer 12 may, in particular, be formed such above the second region 25, that the mask window 13 may be defined by the opening 140 in the first mask layer 11. The width of the mask window 13 can be controlled by controlling the width of the opening 140 when etching into the first mask layer 11. Further, the charge region 26 is formed in FIG. 16, particularly by implanting dopants through the mask window 13 into the semiconductor layer 23 (as indicated by the arrows). The doping may be as described above for the first alternative (a).

Figure 17:
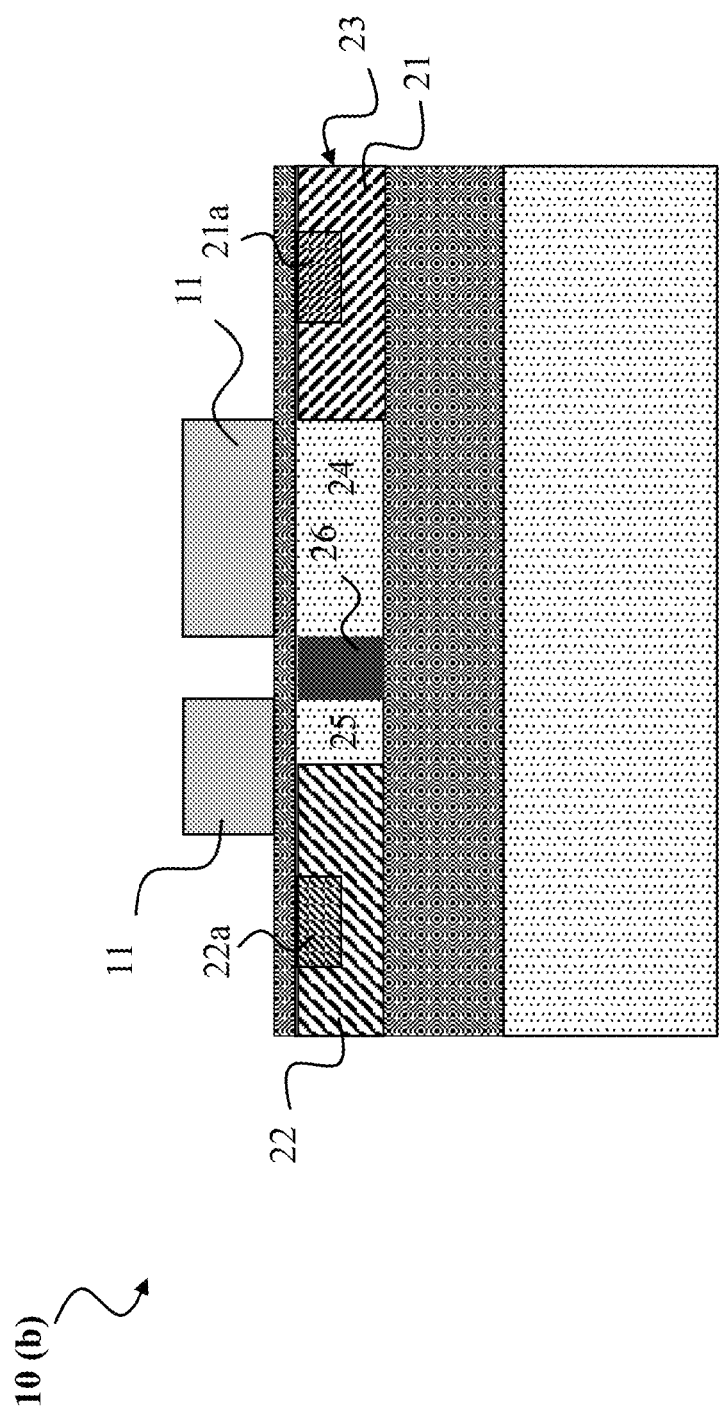
FIG. 17 shows a further step of the second alternative of a method according to an embodiment of the disclosure.

FIG. 17 shows that in a next step of the second alternative (b) of the method 10, the second mask layer 12 may be removed, and the highly-doped regions 21a and 22a are formed in the first contact region 21 and the second contact region 22, respectively. These highly-doped regions 21a and 22a, may be formed by implantation of dopants (as described for the first alternative (a)).

Figure 18:
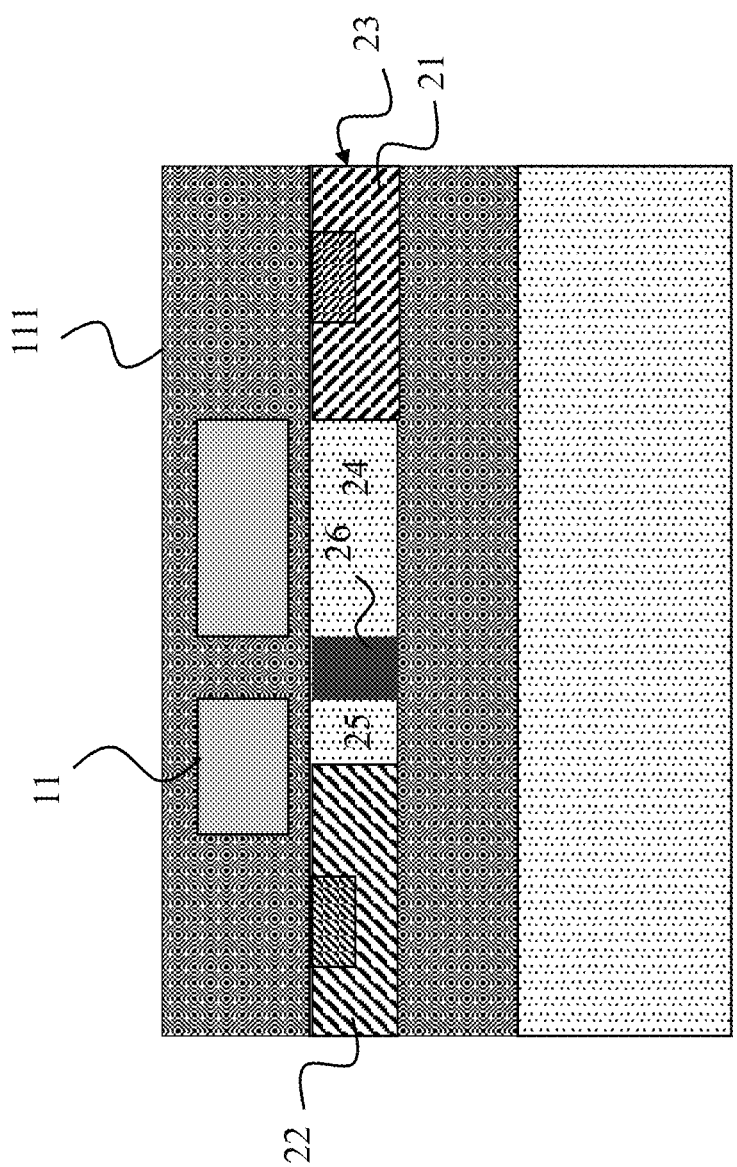
FIG. 18 shows a further step of the second alternative of a method according to an embodiment of the disclosure.

FIG. 18 shows that in a next step of the second alternative (b) of the method 10, a sacrificial layer 111 may be formed around the first mask layer 11. The sacrificial layer 111 may comprise an oxide, for instance, silicon oxide. After forming the sacrificial layer 111, the top surface of the structure may be planarized to form a planar surface.

Figure 19:
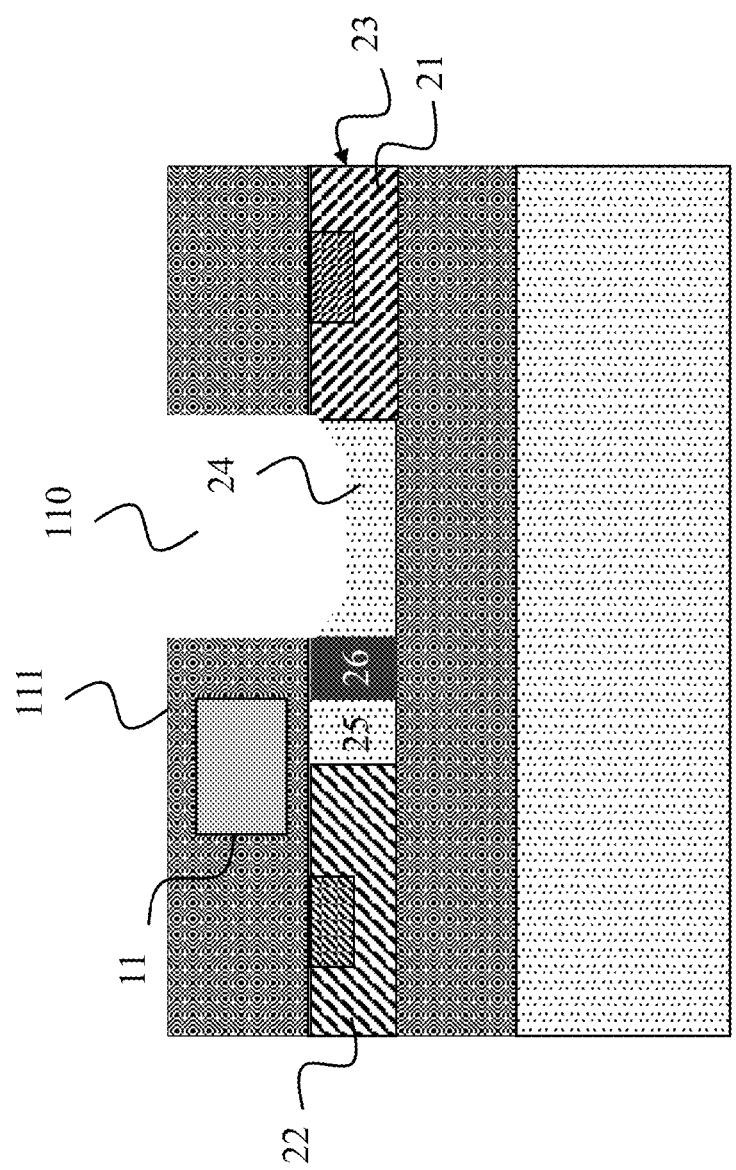
FIG. 19 shows a further step of the second alternative of a method according to an embodiment of the disclosure.

FIG. 19 shows that in the next step of the second alternative (b) of the method 10, the first mask layer 11 may be removed above the first region 24 (here it may remain, however, above the second region 25), wherein a sacrificial layer window 110 may be formed. That is, the window 110 may be formed by etching into the sacrificial layer 111, wherein the first mask layer 11 is removed. The first mask layer 11 may thus be used, as in the first alternative (a), to align the window 110. Notably, the etching of the sacrificial layer window 110 may also etch into the first region 24 of the semiconductor layer 23, to form an indentation.

Figure 20:
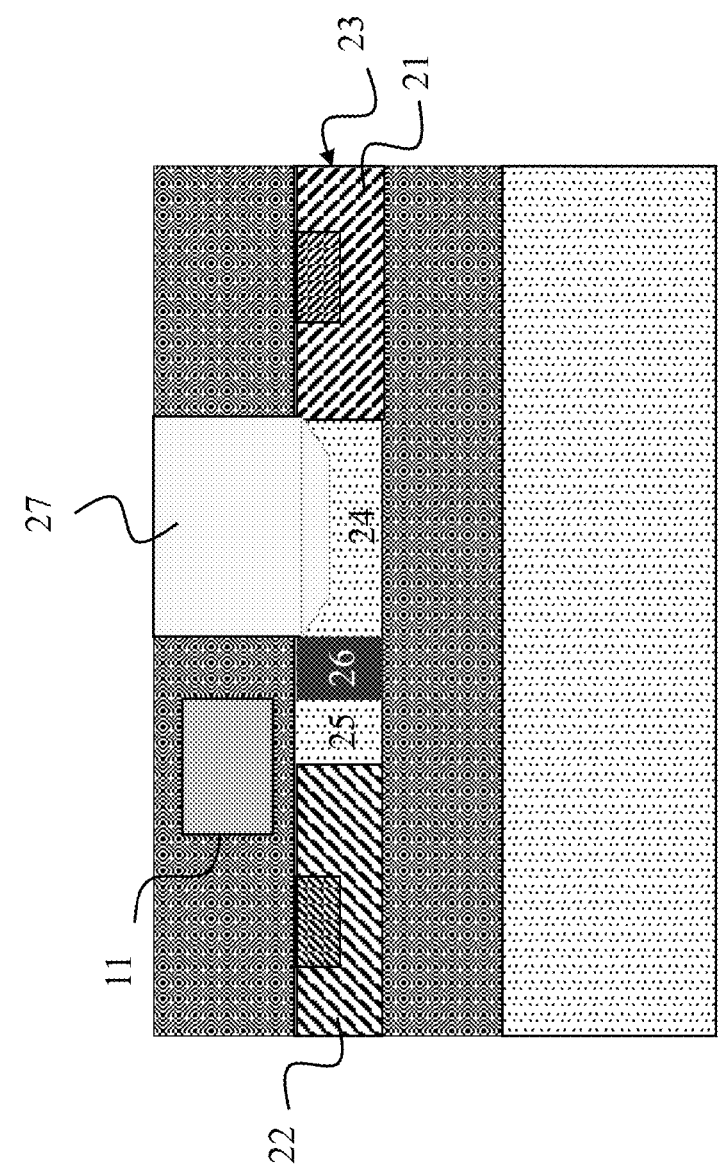
FIG. 20 shows a further step of the second alternative of a method according to an embodiment of the disclosure.

FIG. 20 shows that in a next step of the second alternative (b) of the method 10, absorption material may be deposited into the sacrificial layer window 110, onto the first region 24, thereby forming the absorption region 27. Further, the absorption region 27 may be formed in the indentation of the first region 24 of the semiconductor layer 23, in particular, in an indentation spanning the first region 24. The step may also comprise CMP to planarize the surface of the absorption region 27 and the sacrificial layer 111. In particular, the absorption region 27 may comprise germanium as absorption material, or a germanium-based material. The absorption material may be epitaxially grown into the window 110 to form the absorption region 27.

Figure 21:
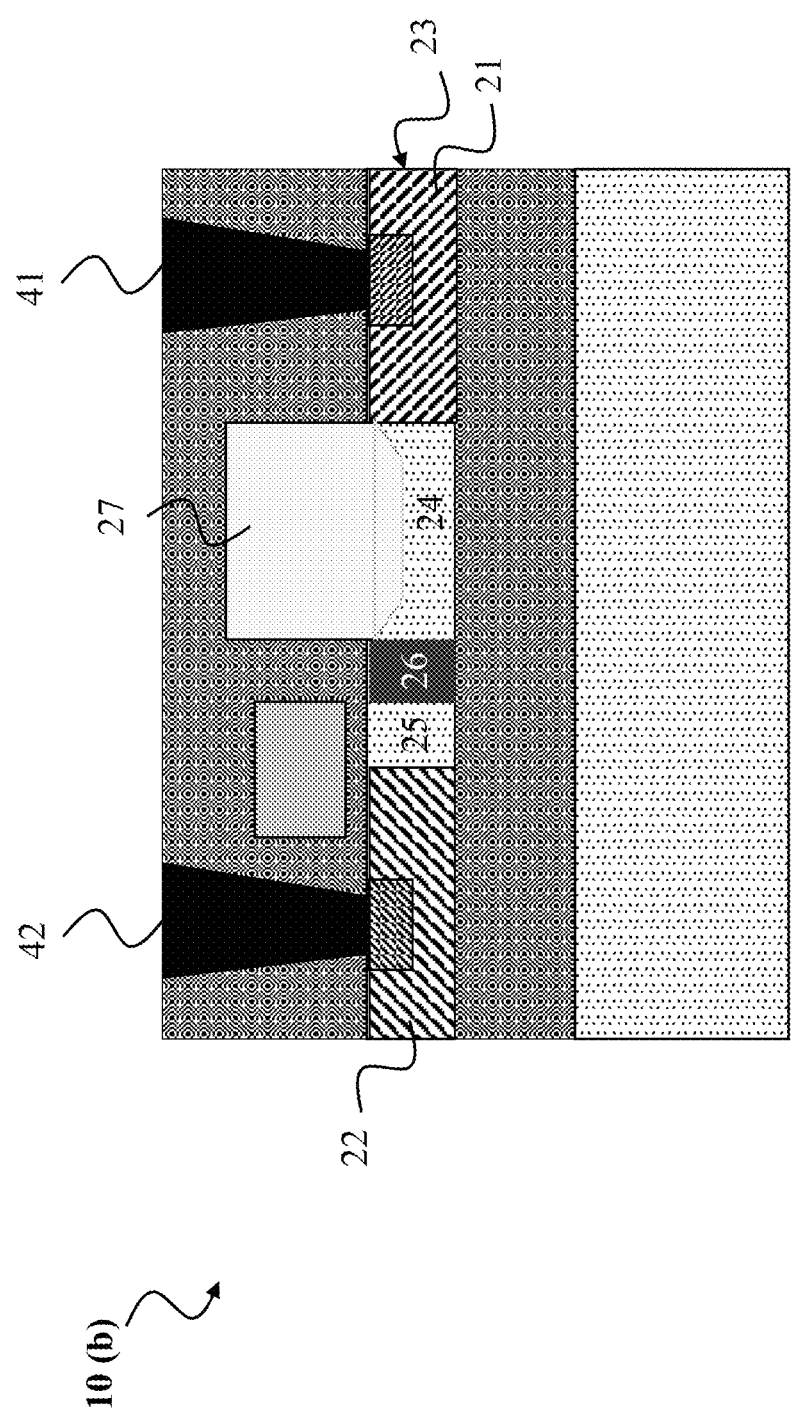
FIG. 21 shows a further step of the second alternative of a method according to an embodiment of the disclosure.

FIG. 21 shows that in a final step of the second alternative (b) of the method 10, BEOL processing may be performed, wherein the first contact 41 may be formed on the first contact region 21 and the second contact 42 may be formed on the second contact region 22. This concludes the processing of the APD device 20 according to the second alternative (a) of the method 10.

In the above-mentioned embodiments, certain materials may be used. In particular, the semiconductor layer 23 may comprise silicon. The first mask layer 11 may comprise poly-Si. The second mask layer 12 may comprise a resist. The absorption region 27 may comprise germanium. The first and second contacts 41 and 42 may comprise tungsten.

The method 10 according to its embodiments, implementations and alternatives described above for fabricating the APD device 20, may in particular be used for avalanche photodetectors, photodetectors and single photon avalanche photodetectors. These devices are typically used in applications such as optical interconnections, optical communication, local optical quantum computing, quantum communication, terahertz communication, terahertz imaging, or sensing.

The invention claimed is:

1. A method for fabricating an avalanche photodiode device, the method comprising:
forming a first contact region and a second contact region in a semiconductor layer;
forming a first mask layer above at least a first region of the semiconductor layer adjacent to the first contact region;
forming a second mask layer above and laterally overlapping the first mask layer, wherein a mask window is defined by the first mask layer and the second mask layer, and wherein the first mask layer and/or the second mask layer are formed above a second region of the semiconductor layer adjacent to the second contact region;
forming a charge region in the semiconductor layer through the mask window, wherein the charge region is formed between the first region and the second region; and
forming an absorption region on the first region using the first mask layer.

2. The method according to claim 1, wherein:
the charge region is adjacent to the first region; and
the charge region is laterally adjacent to the absorption region.

3. The method according to claim 1, wherein:
the charge region is adjacent to the first region; or
the charge region is laterally adjacent to the absorption region.

4. The method according to claim 1, wherein:
the charge region has a width of below 100 nm.

5. The method according to claim 1, wherein:
the charge region has a width in a range of 50-60 nm.

6. The method according to claim 1, wherein:
the second region is configured to function as an amplification region in the avalanche photodiode device.

7. The method according to claim 1, wherein:
the charge region is formed by implanting dopants through the mask window into the semiconductor layer.

8. The method according to claim 7, wherein:
a width of the mask window is controlled by controlling a lateral arrangement of the second mask layer relative to the first mask layer when forming the second mask layer.

9. The method according to claim 1, wherein the first mask layer is formed above the first region and above the second region of the semiconductor layer, and the method further comprises:
etching into the first mask layer to obtain an opening in the first mask layer; and
forming the second mask layer above the first mask layer such that the mask window is defined by the opening in the first mask layer.

10. The method according to claim 9, wherein:
a width of the mask window is controlled by controlling a width of the opening when etching into the first mask layer.

11. The method according to claim 1, wherein the first mask layer is formed only above the first region, and the method further comprises:
forming the second mask layer above the second region such that the mask window is defined by a gap region where the first mask layer and the second mask layer do not laterally overlap.

12. The method according to claim 1, wherein:
the first mask layer is formed by depositing polycrystalline silicon onto the semiconductor layer and then patterning the polycrystalline silicon.

13. The method according to claim 1, wherein:
the second mask layer is formed by applying a resist and then patterning the resist.

14. The method according to claim 1, wherein the absorption region is formed by:
removing the second mask layer;
forming a sacrificial layer around the first mask layer;
removing the first mask layer above the first region, thereby forming a sacrificial layer window; and depositing absorption material through the sacrificial layer window onto the first region, thereby forming the absorption region.

15. The method according to claim 1, wherein:

the absorption region is formed by absorption material that comprises germanium; and the absorption region is formed by epitaxial growth of the absorption material.

16. The method according to claim 1, wherein:

the absorption region is formed by absorption material that comprises germanium; or the absorption region is formed by epitaxial growth of the absorption material.

17. The method according to claim 1, wherein the absorption region is formed in an indentation of the semiconductor layer.

18. The method according to claim 1, wherein the absorption region is formed in an indentation of the semiconductor layer spanning the first region.

19. The method according to claim 1, further comprising:

forming a first contact on the first region and a second contact on the second region; and/or not forming any contact on the absorption region.

20. An avalanche photodiode device fabricated by using the method according to claim 1.

* * * * *